United States Patent
Yamada et al.

[11] Patent Number: 6,163,369
[45] Date of Patent: Dec. 19, 2000

[54] PLANE POSITION DETECTING METHOD AND EXPOSING METHOD AND EXPOSURE APPARATUS USING SAME

[75] Inventors: Yuichi Yamada; Atsushi Kawahara, both of Utsunomiya, Japan

[73] Assignee: Canon Kabushiki Kaisha, Tokyo, Japan

[21] Appl. No.: 09/205,173

[22] Filed: Dec. 4, 1998

[30] Foreign Application Priority Data

Dec. 9, 1997 [JP] Japan ................................ 9-354052

[51] Int. Cl.$^7$ ............................ G03B 27/52; G01B 11/00
[52] U.S. Cl. ............................ 355/55; 355/53; 355/56; 355/71; 356/399; 356/400
[58] Field of Search ................................ 355/53, 55, 56, 355/71; 356/399, 400

[56] References Cited

U.S. PATENT DOCUMENTS

| | | | |
|---|---|---|---|
| 4,962,423 | 10/1990 | Yamada et al. | 358/101 |
| 5,323,016 | 6/1994 | Yamada et al. | 356/400 |
| 5,361,122 | 11/1994 | Kataoka et al. | 355/53 |
| 5,777,722 | 7/1998 | Miyazaki et al. | 355/53 |
| 5,801,835 | 9/1998 | Mitzutani et al. | 356/375 |
| 5,825,043 | 10/1998 | Suwa | 355/55 |
| 5,969,800 | 10/1999 | Makinouchi | 355/53 |
| 6,018,384 | 1/2000 | Ota | 355/53 |

FOREIGN PATENT DOCUMENTS 4-116414   4/1992   Japan .

*Primary Examiner*—Russell Adams
*Assistant Examiner*—Khaled Brown
*Attorney, Agent, or Firm*—Fitzpatrick, Cella, Harper & Scinto

[57] ABSTRACT

The position or the inclination of a substrate surface is detected at a high accuracy and a high speed, and corrected. When moving the substrate in a direction substantially at right angles to an optical axis of a projection optical system and feeding an area on the substrate into an image space of the projection optical system, at least one of the position and inclination in the optical axis direction of the substrate is detected, to bring that area into focus with the focal plane of the projection optical system. One of a first mode of conducting the measurement during travel of the substrate and a second mode of performing the measurement in a state in which that area has substantially been positioned in the image space is selected.

28 Claims, 12 Drawing Sheets

TRAVELING DIRECTION
OF OPTICAL AXIS →

PLANE POSITION DETECTING METHOD AND EXPOSING METHOD AND EXPOSURE APPARATUS USING SAME

BACKGROUND OF THE INVENTION

1. Field of the Invention

The present invention relates to a plane position detecting method of detecting a position or an inclination (plane position) of a substrate surface relative to an optical axis direction of a projection optical system, and an exposing method and an exposure apparatus using the same.

2. Description of the Related Art

Improvements in productivity are now strongly demanded as the current performance that is required in a semiconductor manufacturing apparatus, particularly in a sequential travel type semiconductor exposing apparatus known as a stepper. That is, a chip maker has to reduce the unit chip cost so as to be able to prevent a memory cost meeting chip replacement, to cope with the increase in the degree of integration along with the memory trend.

Under these circumstances, an exposure apparatus maker must provide an apparatus that can contribute to the improvement in productivity, in addition to providing a high performance, with basic properties such as resolution and positioning accuracy, and furthermore, must increase the processing capacity per unit time, i.e., the number of processed wafers.

Methods of reducing the stepping time of a semiconductor exposure apparatus used in a production site include methods proposed in Japanese Patent Publication No. 4-50731 and Japanese Patent Laid-Open No. 4-116414. These patent publications disclose methods of detecting a position or an inclination of a substrate surface during step travel on an XY plane of a substrate, such as a semiconductor wafer. With these methods, as compared to a conventional method of detecting a position of a substrate relative to a z-axis direction or an inclination of the XY plane through confirmation of positioning of the substrate at an exposing position on the XY plane, the timing of starting of the plane position correction (i.e., the correction of a position in the z-axis direction or an inclination in the XY plane) becomes earlier, thus making it possible to reduce the stepping time as a whole.

There are also proposed a method of reducing the stepping time by previously calculating a focus offset so that a measured value at a measuring position during step travel of a substrate (hereinafter, referred to as a "measuring position during travel") becomes equivalent to a measured value at an exposing position of the substrate, and positively utilizing a measured value of the plane position during travel, and a method of reducing the stepping time through reduction of the measuring time by performing measurement with a focus detection range limited by taking into account a continuous step travel.

To date, an exposure wavelength for an exposure apparatus in the process design for the manufacture of semiconductors has been selected corresponding to the wiring rule: for example, an i-line stepper is used for a 0.35-$\mu$m rule, and a KrF excimer laser stepper for a 0.25-$\mu$m rule. That is, the manufacturing has been performed with the exposure wavelength in use setting the limit of the resolution line width, and the limit for the focal depth has inevitably been set to a value of about 1.0 $\mu$m, which has been shared by the equipment and the process.

However, a new policy has recently been adopted, to continue to use a KrF excimer laser in an exposure apparatus as the light source to serve as the exposure technique with the next generation, having a 0.18-$\mu$m rule. There is also a move to utilize KrF excimer laser exposure until mass production of 1-giga DRAMs of 0.1-$\mu$m rule is achieved. The development of refining techniques such as a phase shift mask and super-resolution, as well as improvement of intra-chip flatness resulting from the adoption of CMP (chemical-mechanical polishing) make important contributions to this general trend. The use of CMP is reported to permit the reduction of a chip stage in a trench structure to within about 50 nm, and it is now possible to design a high numerical aperture (high-NA) lens having a sharply reduced focal depth and to impart a resolution under that of the wavelength of the exposure light being used.

To cope with the decrease in the focal depth resulting from the tendency toward a high NA, on the other hand, it is necessary to further improve the correction accuracy of the focusing and leveling. More specifically, methods for assuring the accuracy of the chip stage on the process side are diverse among the various semiconductor chip makers, including CMP, PSM (phase shift mask) and RA (recessed array). The manufacture of chips of the same generation with different margins of focal depth for the individual semiconductor chip makers is about to begin. As a result, it may be necessary to achieve a higher correction accuracy for a particular process for individual semiconductor chip makers, particularly for a process in which it is difficult to achieve perfect frames by the application of the stacking method.

Under these circumstances, the present inventors have found that, in the conventional method of performing corrective driving by offset-correcting a measured value during travel, the offset reproducibility slightly varies with the position of a shot on a wafer serving as the substrate, so that the correction accuracy may, in some cases, deviate from the standard, depending upon the position of the shot on the wafer.

This is chiefly attributable to the fact that, because the exterior shape of the wafer itself has been scaled up in order to cope with a 300-mm wafer and the like, and the amplitude (Z-direction) of the structural deformation in the tilting direction of the stage becomes larger along with the expansion of the wafer in the radial direction, a difference occurs in reproducibility of any offset between the wafer periphery and inside portions of the wafer. This instability, which is within a tolerable range in the conventional accuracy, leads to a non-negligible amount when covering a residual chip stage, as mentioned above, on the exposure apparatus side.

In a conventional method of focusing by limiting the focus detection range to reduce the stepping travel time, in a sequence other than exposure, such as during the execution of a step command after execution of a user operation, the surface to be detected may sometimes exceed the focus detection range, which may cause stoppage of the sequence.

SUMMARY OF THE INVENTION

In view of the foregoing problems associated with the conventional art, the present invention has an object to provide a plane position detecting method that permits detection of a position or an inclination of a substrate surface at a high accuracy and a high speed in a process subjected to strict requirements for focal depth beyond current pattern refinement trends or the like, and an exposing method and an exposure apparatus using the same.

To achieve the aforementioned object, the plane position detecting method of the present invention comprises the steps of moving a substrate in a direction intersecting an optical axis of a projection optical system substantially at right angles, feeding an area on the substrate into an image space of the projection optical system, detecting at least one of a position and an inclination of the substrate in the optical axis direction, determining when the area agrees with a focal plate of the projection optical system, and selecting one of a first mode of performing the detection during travel of the substrate and a second mode of performing the detection in a state in which the area is substantially positioned within the image space. This plane position detecting method is particularly applicable to a sequential traveling type semiconductor exposure apparatus (stepper).

In another aspect of the invention for achieving the aforementioned object, there is provided a plane position detecting method comprising the steps of sequentially feeding a plurality of areas to be exposed on a substrate to exposure positions, detecting at least one of a position and an inclination of the substrate in substantially the exposure optical axis direction, accomplishing plane positioning of the areas to be exposed at the exposure positions, on the basis of the detection, and switching over, within the substrate, a mode of the detection between one during feeding travel for feeding the substrate and one in a state in which the areas to be exposed are substantially positioned at the exposure positions.

An exposure apparatus of a preferred embodiment of the invention comprises a projection optical system, a stage which travels in a direction intersecting the optical axis of the projection optical system substantially at right angles, while mounting a substrate, thereby feeding an area to be detected on the substrate to an image plane of the projection optical system, a detector which detects at least one of a position and an inclination relative to the optical axis direction of the substrate and produces a detection value, and a focusing unit which brings the area to be detected into focus with a focal plane of the projection optical system, on the basis of the detection value of the detector. The exposure apparatus has two manners of stepping travel that can be selected by selecting means: one (type B) of bringing the area to be detected into focus with the focal plane on the basis of the plane position information measured during travel, and another (type A) of bringing the area to be detected into focus with the focal plane on the basis of the plane position information in a state in which the area to be detected has substantially been positioned, relative to the traveling direction, at the image plane position of the projection optical system.

By properly selecting one of the speed-oriented manner of stepping travel (type B) of bringing the area to be detected into focus with the focal plane on the basis of the plane position information measured during travel, and the accuracy-oriented manner of stepping travel (type A) of bringing the same into focus with the focal plane on the basis of the plane position information in a state in which the area to be detected has substantially been positioned at the image plane position optical system, the above-mentioned problems can be solved.

High-speed and high-accuracy automatic chip exposure job design is possible by previously setting a manner of stepping travel for each shot on the basis of layout information, in terms of the selection of a manner of stepping travel, and bringing each shot in focus with the focal plane in accordance with the thus previously set manner of stepping travel.

It is possible to avoid stoppage of the exposure sequence, by selecting a manner of stepping travel in response to the position of the stage immediately before a start of stepping travel, so as to bring the area to be detected into focus with the focal plane.

It is also possible to change the detection range and the detection time, respectively, by switching over the detecting range of the focus detecting means in response to the manner of stepping travel, and to prepare a chip processing job compatible with both accuracy and productivity by taking into account the processing time as a whole.

An the exposure apparatus of another preferred embodiment of the invention comprises a projection optical system, a stage holding a substrate, the stage traveling in a direction intersecting the optical axis of the projection optical system substantially at right angles, thereby feeding a shot area on the substrate to an image plane of the projection optical system, a detector which detects at least one of a position and an inclination relative to the optical axis direction of the substrate, and a focusing unit which brings the shot area into focus with the focal plane of the projection optical system. This exposure apparatus has (i) a speed-oriented manner of stepping travel (type D) of bringing the shot area into focus with the focal plane on the basis of plane position information measured during travel, and includes automatically determining a correction accuracy, and (ii) an accuracy-oriented manner of stepping travel (type C) of bringing the shot area into focus with the focal plane on the basis of plane position information in a state in which the shot area has substantially been positioned, relative to the traveling direction, at the image plane position of the projection optical system. The aforementioned problems can be solved by automatically selecting the optimum manner of stepping travel from the measuring history of each shot area.

When using the type C manner of stepping travel, for example, if a satisfactory correction accuracy is determined to be available by the type D manner of stepping travel judged from the history of the plane position information during travel, then, the manner is switched over to the type D manner of stepping travel. When using the type D manner of stepping travel, if a satisfactory correction accuracy is determined not to be available by the type D manner of stepping travel judged from the history of the plane position information after focusing of the shot area, then, the manner is changed over to the type C manner of stepping travel. It is, therefore, possible to provide an exposure apparatus permitting high-accuracy and high-speed plane position correction, for example, by setting the type C manner of stepping travel for each shot area on the top wafer of a lot, and constantly switching over the manner of stepping travel on the basis of the history of the plane position information.

According to such an embodiment, it is possible to accurately determine an inclination of an area to be detected relative to the image plane or a shift in the height direction by the use of measured values during travel. Since a manner of stepping travel is previously selected in view of the reproducibility of offset, it is possible to achieve a job design, taking into account both the correction accuracy and processing efficiency for the substrate as a whole. Accurate and prompt processing can be carried out, to transfer a fine pattern in a future high-NA exposure apparatus, by creating a confirmation timing without extending the stepping travel time, regarding the final corrected state of focus.

In another aspect, to achieve the foregoing objects, the present invention provides a method of detecting a plane position, comprising the steps of sequentially feeding a plurality of areas to be exposed on a substrate to exposure positions, detecting at least one of a position and an inclination of the substrate in an exposure axis direction, accomplishing plane positioning of the areas to be exposed at the exposure positions, on the basis of the detection in the detecting step, switching over, within the substrate, a mode of the detection between one during travel for feeding the substrate and one in a state in which the areas to be exposed are substantially positioned at the exposure positions. The switching step can be performed on the basis of layout information of the areas to be exposed on the substrate. The switching step also can be performed on the basis of a history of the results of plane position detection conducted for another substrate.

In another aspect, the method can further comprise conducting exposure to the areas to be exposed, for which positioning has been accomplished.

In yet another aspect, the present invention provides an apparatus for detecting a plane position. The apparatus includes a feeder for sequentially feeding a plurality of areas to be exposed on a substrate to exposure positions, a detector for detecting at least one of a position and an inclination of the substrate in an exposure axis direction, plane positioning means for accomplishing plane positioning of the areas to be exposed at the exposure positions, on the basis of the detection by the detector, and switching means for switching over, within the substrate, a mode of the detection between one during travel for feeding the substrate and one in a state in which the areas to be exposed are substantially positioned at the exposure positions. In one aspect, the switching means can perform the switching on the basis of layout information of the areas to be exposed on the substrate. In another aspect, the switching means can perform the switching on the basis of a history of the results of plane position detection conducted for another substrate. The apparatus can further include means for conducting exposure of the areas to be exposed, for which positioning has been accomplished.

DESCRIPTION OF THE PREFERRED EMBODIMENTS

Figure 1:
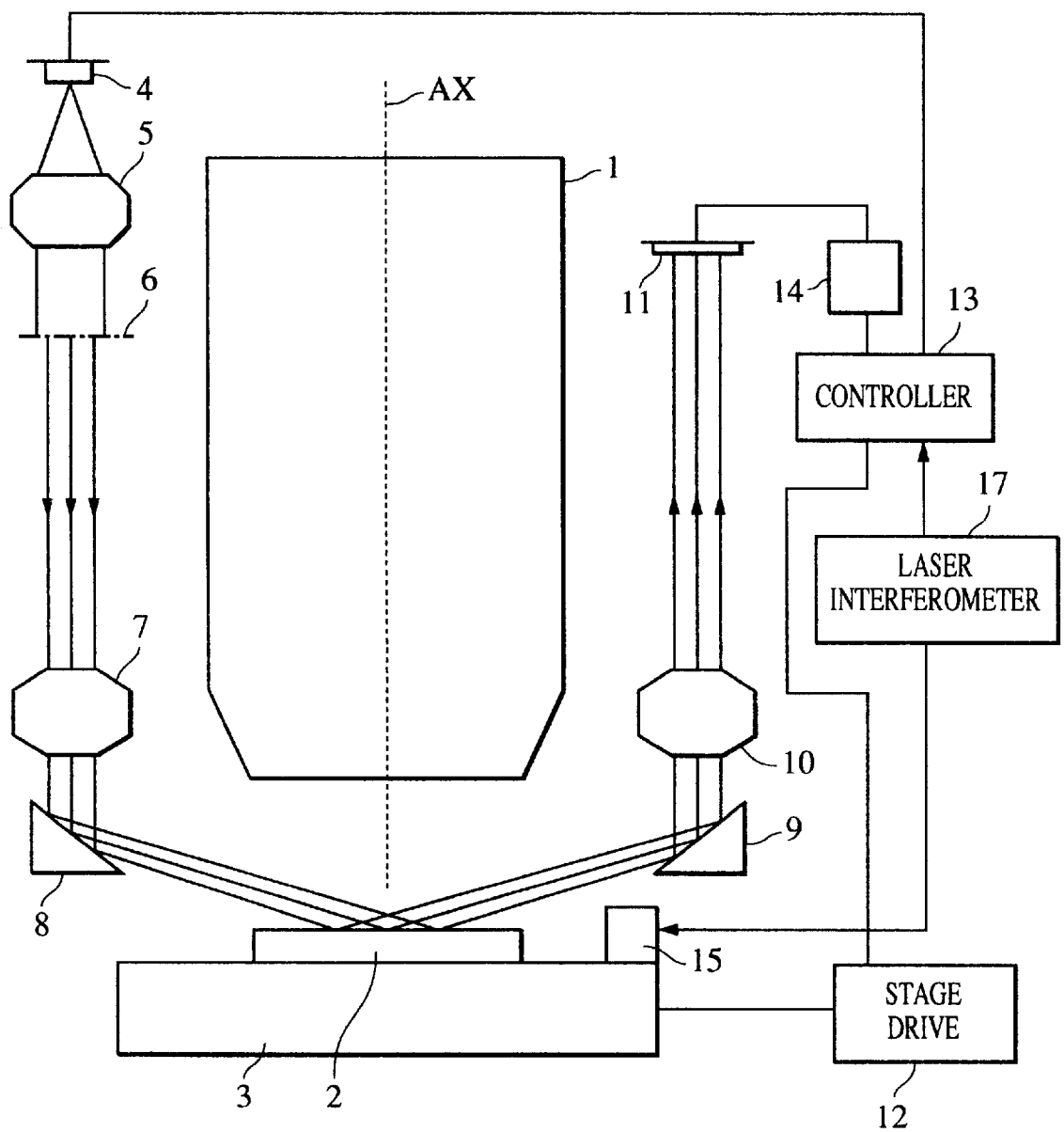
FIG. 1 is a schematic, partial view of a step-and-repeat type reduction projection exposure apparatus of an embodiment of the present invention.

FIG. 1 is a schematic, partial view of a step-and-repeat type reduction projection exposure apparatus of the present invention. In FIG. 1, reference numeral 1 represents a reduction projection lens, and an exposure axis thereof is shown by dotted line AX in the drawing. The reduction projection lens 1 projects a circuit pattern of a reticle (not shown) to, for example, a size reduced to one fifth, and forms a circuit pattern image on a focal plane thereof. The optical axis AX is parallel to the Z-axis direction in FIG. 1. Reference numeral 2 represents a semiconductor wafer having a resist coated on the surface thereof. A plurality of areas to be exposed (shots) having the same patterns formed in a preceding exposure process are arranged on the upper surfaces of semiconductor wafer 2.

In FIG. 1, reference numeral 3 represents a wafer stage for mounting wafer 2. The wafer 2 is attracted by (e.g., by vacuum), and fixed to, the wafer stage 3. The wafer stage 3 comprises an X-stage moving in the X-axis direction, a Y-stage moving in the Y-axis direction, and a θ-Z-leveling stage moving in the Z-axis direction and rotating around axes parallel to the X, Y and Z-axis directions. The X, Y and Z-axes intersect each other at right angles.

By driving the wafer stage 3, therefore, the surface position of the wafer 2 can be adjusted in the optical axis AX direction (Z-axis direction) of the reduction projection lens 1, and in the X, Y or θ direction within a plane crossing the optical axis AX at right angles (i.e., the X-Y plane), and further, it is also possible to adjust also the inclination relative to the focal plane of the reduction projection lens 1, i.e., relative to the circuit pattern image (i.e., the rotating directions around the X- and Y-axes).

In FIG. 1, reference numerals 4 to 11 represent elements of detectors that are provided to detect the surface position and inclination of the wafer 2: 4 representing an illuminating light source, which is a high-luminance light source, such as a light-emitting diode or a semiconductor laser; and 5 an illuminating lens. A light beam emitted from the light source 4 forms parallel luminous fluxes through the illuminating lens 5 and illuminates a mask 6 having a plurality (five, for example) of pinholes formed therein. The luminous fluxes having passed through the pinholes of the mask 6 enter a folding mirror 8 via an image forming lens 7, and after having their direction changed through the folding mirror 8, illuminate the surface of the wafer 2. At this point, the image forming lens 7 and the folding mirror 8 form images of the plurality of pinholes of the mask 6 on the wafer.

Figure 2:
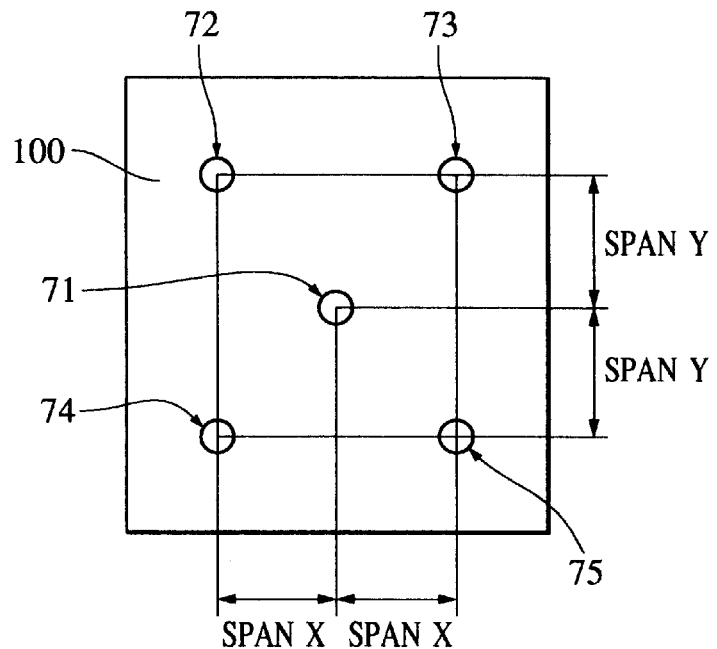
FIG. 2 illustrates an arrangement of exposure position measuring points set in an area to be exposed in the embodiment shown in FIG. 1.

As shown in FIG. 2, the luminous fluxes having passed through the plurality of pinholes irradiate five points (71 to 75), including the center of an area 100 of the wafer 2 to be exposed, and are reflected from these points. That is, in this embodiment, five pinholes are formed in the mask 6, and positions of the five measuring points (71 to 75), including the center in the area to be exposed 100, are measured, as will be described later.

Referring back to FIG. 1, the luminous fluxes reflected from the measuring points (71 to 75) change their direction at a folding mirror 9, and then enter a position detecting element 11, formed by two-dimensionally arranging photo-detecting elements, via a detecting lens 10. The detecting lens 10 forms images of the pinholes of the mask 6 on the position detecting element 11 in cooperation with the image forming lens 7, the folding mirror 8, the wafer 2 and the folding mirror 9. The mask 6, the wafer 2 and the position detecting element 11 are arranged in optically conjugate positions with respect to each other.

When the arrangement shown schematically in FIG. 1 is difficult from the point of view of optical layout, a plurality of position detecting elements 11, corresponding to the individual pinholes, may be arranged. The position detecting elements 11 comprise two-dimensional CCDs or the like, and can independently detect incident positions of the plurality of luminous fluxes via the plurality of pinholes onto light receiving surfaces of the position detecting elements 11. A change in position of the wafer 2 in the direction of the optical axis AX of the reduction projection lens 1 can be detected as a shift of the incident position of the plurality of luminous fluxes onto the position detecting elements 11. As a result, the positions of the wafer 2 at the fine measuring points (71 to 75) in the area to be exposed 100 in the direction of the optical axis on the wafer surface are entered into a controller 13, via a plane position detecting apparatus 14, as output signals from the position detecting elements 11.

Displacement of the wafer stage 3 in the X-axis and Y-axis directions is measured by a known method by the use of a reference mirror 15 provided on the wafer stage and a laser interferometer 17, and a signal representing an amount of displacement of the wafer stage 3 is entered into the controller 13 from the laser interferometer 17 via a signal line. The travel of the wafer stage 3 is controlled by a stage drive 12. The stage drive 12 receives an instruction signal from the controller 13 via a signal line, and servo-drives the wafer stage 3 in response to this signal. The stage drive 12 has a first driving unit and a second driving unit: it adjusts the position (X, Y) and the rotation (θ) within a plane intersecting the optical axis AX of the wafer 2 at right angles by the use of the first driving unit, and adjusts the position (Z) and the inclination ($\alpha$, $\beta$) in the direction of the optical axis AX of the wafer 2 by the use of the second driving unit.

The plane position detecting apparatus 14 processes output signals from the position detecting element 11 (plane positional data), and detects the surface position of the wafer 2. The result of this detection is transferred to the controller 13: the second driving unit of the stage drive 12 is operated by a prescribed instruction signal, thereby adjusting the position and the inclination of the wafer 2 in the optical axis AX direction.

The focus detecting position in this embodiment will now be described. In this embodiment, two measuring points are set: a measuring point during travel (position) used basically for calculating a corrected amount of driving, and an exposure position measuring point that serves as a reference for calculating offset, mainly for the purpose of correcting a value measured at the aforementioned position, so as to be equivalent to the measured value at the exposure position.

First, the exposure position measuring point is illustrated in FIG. 2. A measuring point 71 is substantially at the center of the area 100 to be exposed, and intersects the optical axis AX at the exposure position. The remaining measuring points 72 to 75 are located along the periphery of the area 100 to be exposed.

In all of the shots in a wafer, the exposure position measuring points to be covered (i.e., measured by sensors using detecting portions of the position detecting element 11) are stepped in shape. Therefore, an offset value, dependent upon the step shape for each sensor when the image forming plane of the reduction projection lens 1 is used as a reference plane, is primarily determined for each sensor. Accordingly, when an inclination and a position in the height direction of a chip are detected for a stage positioned at the exposure position, it is not necessary to change the offset for each shot.

Figure 3:
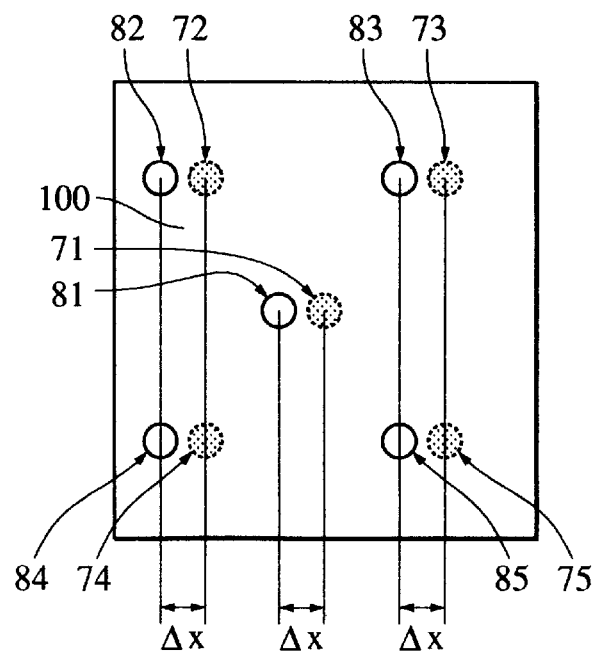
FIG. 3 illustrates an arrangement of measuring points during travel set in an area to be exposed in the embodiment shown in FIG. 1.

An example of an in-travel measuring point for measuring during traveling is illustrated in FIG. 3. In FIG. 3, a measuring point 81 is measured during travel, in place of the measuring point 71, at a position intersecting with the optical axis AX. More specifically, the direction of travel of wafer 2 in the drawing is from right to left, and, for the individual measuring points 71 to 75, positions of in-travel measurement shift to the right on the chip 100, as represented by measuring points 81 to 85.

Figure 4:
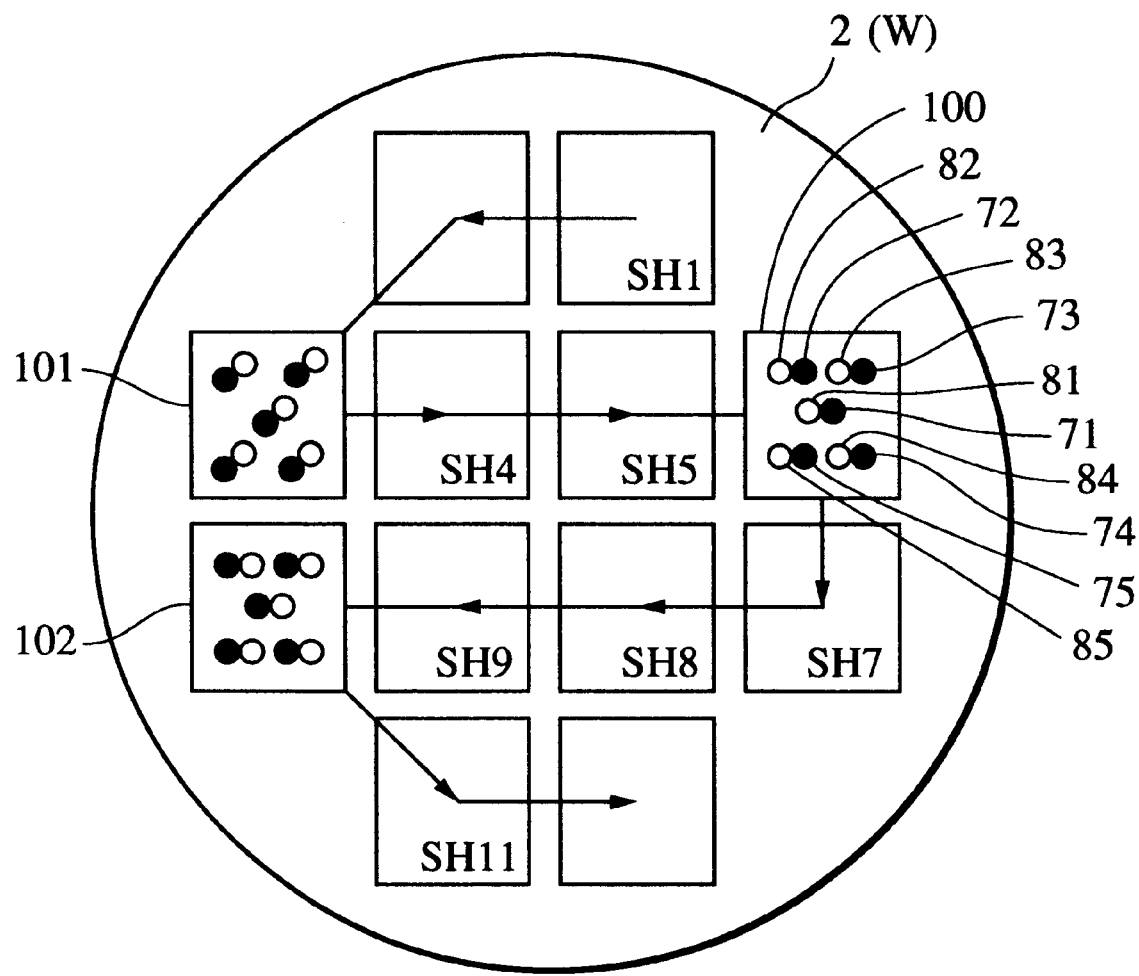
FIG. 4 illustrates exposure positions arranged on a wafer, correspondence of the individual measuring positions, and stepping travel between shots.

When conducting measurement during stepping travel, as mentioned above, the detectors (4 to 11) would measure the surface having a step different from that when the chip 100 is at the exposure position, strictly speaking, by an amount corresponding to a change in the relative position of the chip 100. Even a shot layout containing only twelve shots on the wafer 2, as shown in FIG. 4, has five different measuring points (left, right, top right, top left and top), and may even have up to eight in-travel measuring points.

In addition, a change in the main body structure between in-travel measuring points is equal to a Z-direction displacement available by multiplication by the shot position from the center, as derived from the relationship between the shot position (X, Y) on the wafer 2 and the posture deformation ($\alpha$, $\beta$) at that point, even when the posture deformation ($\alpha$, $\beta$) is the same for all runs of stepping travel, resulting in different values for different shots. This main body deformation, however, being confirmed to exhibit a high reproducibility, can be controlled as an offset for each shot, just as an offset resulting from a step in a shot.

The two manners of stepping used in this embodiment including the speed-oriented manner of stepping (type B) and the correction accuracy-oriented manner of stepping (type A) will now be described with reference to the flowcharts shown in FIGS. 5 and 6.

Figure 5:
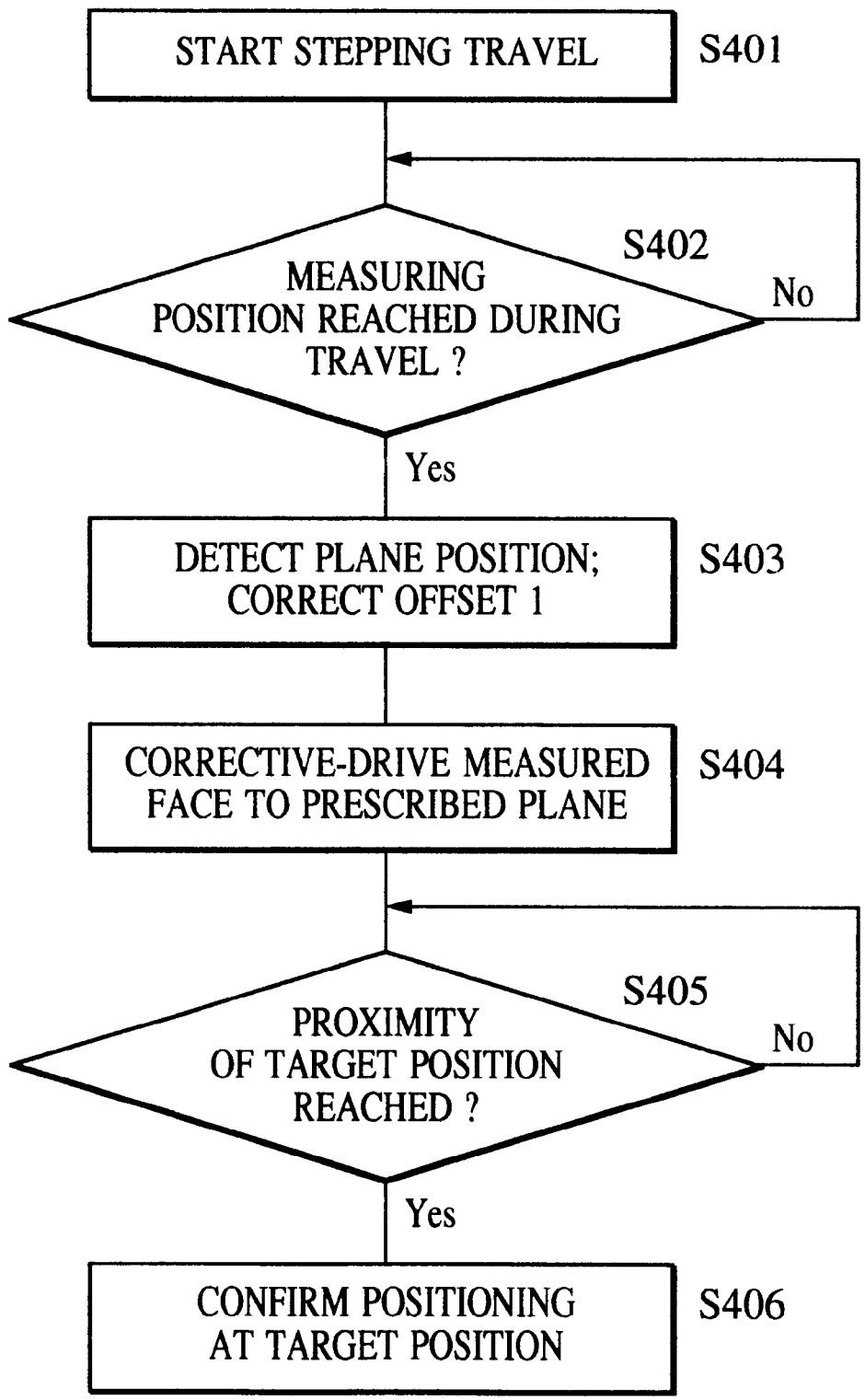
FIG. 5 is a flowchart illustrating a speed-oriented stepping travel of the embodiment shown in FIG. 1.
Figure 6:
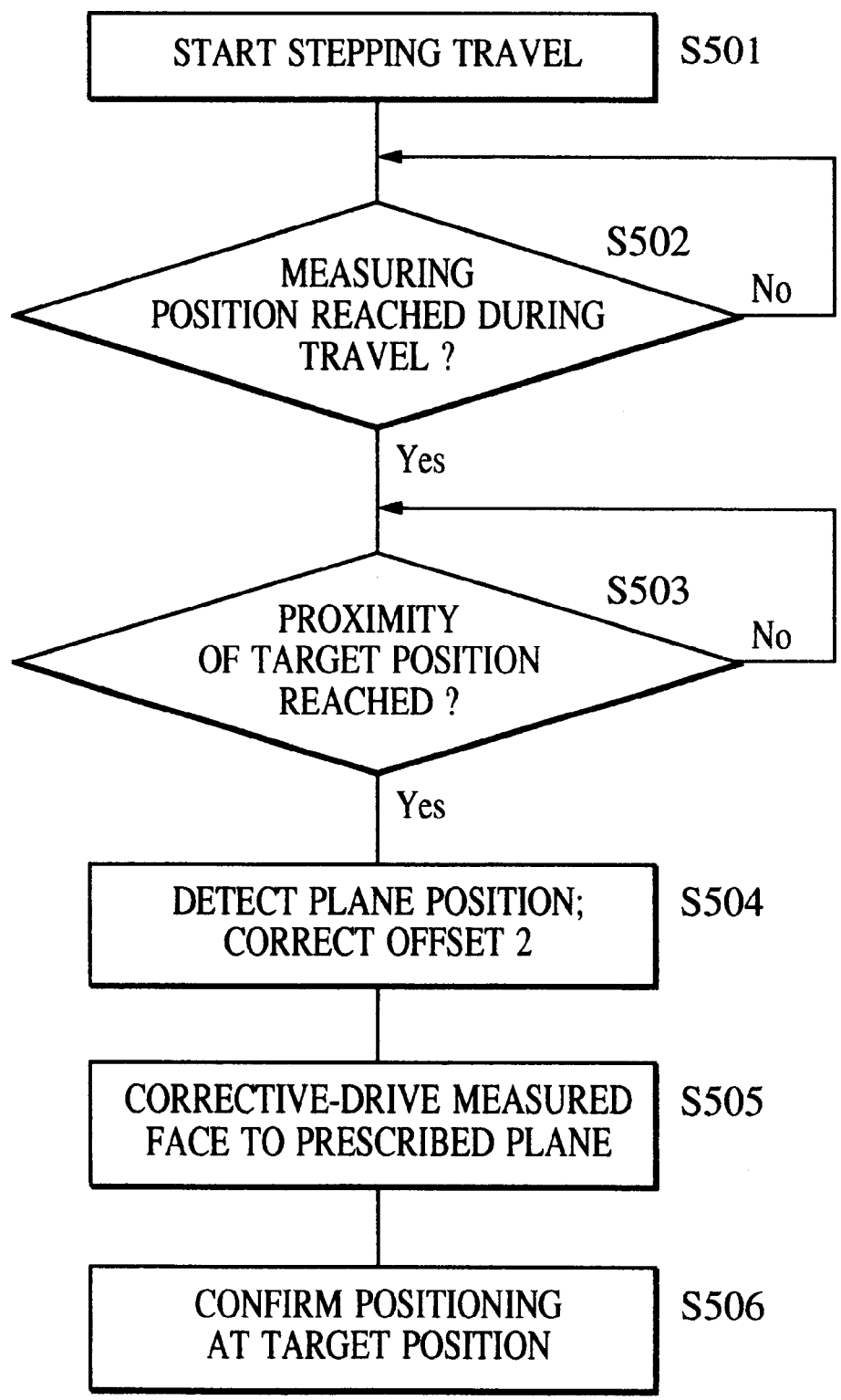
FIG. 6 is a flowchart illustrating an accuracy-oriented stepping travel of the embodiment shown in FIG. 1.

In the speed-oriented manner of stepping (type B) shown in FIG. 5, the stage 3 starts stepping travel of the wafer 2 at step S401. At step S402, it is determined whether or not the wafer 2 has reached the in-travel measuring position before the wafer 2 reaches the target position, while always reading in the current position of the stage 3 via the laser interferometer 17. When the wafer 2 is determined to have reached the focus measuring position during travel, the detectors (4 to 11) perform focus measuring at step S403. Then, at step S404 the measured value is corrected by the use of an offset unique to a determined in-travel measurement periphery, i.e., an offset caused by an apparatus deformation in the state of the apparatus at a target position, such as the exposure position, or by a step in the substrate at a position other than the target position (hereinafter referred to as the "focus offset 1"). After calculating a corrected amount of driving from data after correction, a determination is repeated, at step S405, on the basis of measured values of the detectors (4 to 11) until the wafer 2 reaches the proximity to a specified target position in terms of the position in the Z-axis direction and the inclination. When the wafer 2 is confirmed to have reached the proximity location, completion of the final positioning is confirmed at step S406.

The correction accuracy-oriented manner of stepping (type A) will now be described with reference to FIG. 6. At step S501, the stage 3 starts stepping travel of the wafer 2, and at step S502, a determination is made as to whether or not the wafer 2 has reached the in-travel measuring position, before the wafer 2 reaches the target position, while always reading in the current of the stage 3 via the laser interferometer 17. When the in-travel focus measuring position is determined to have been reached, at step S503, a determination is repeated until the proximity to a specified target position is reached. Only after confirming that the proximity to the specified target position has been reached, do the detectors (4 to 11) perform focus measurement at step S504. Then, the measured value is corrected by the use of a previously determined offset, i.e., an offset caused by a step in the substrate at a target position, such as the exposure position, and an amount of corrective driving is calculated from data after correction. At step S505, the aforementioned second drive conducts a corrective driving, and then at step S506, the completion of final positioning is confirmed.

These two manners of stepping differ in that, while the former conducts measurement during travel and starts early correction of the plane position of the stage 3 (wafer 2), the latter starts correction of the plane position of the stage 3 (wafer 2) upon reaching the proximity to the target position. In FIG. 6, step S502 is provided to show the absence of processing upon reaching the measuring point during travel. The sequence may, however, comprise waiting to reach the proximity to the target position at step S503, immediately following step S501.

Figure 7:
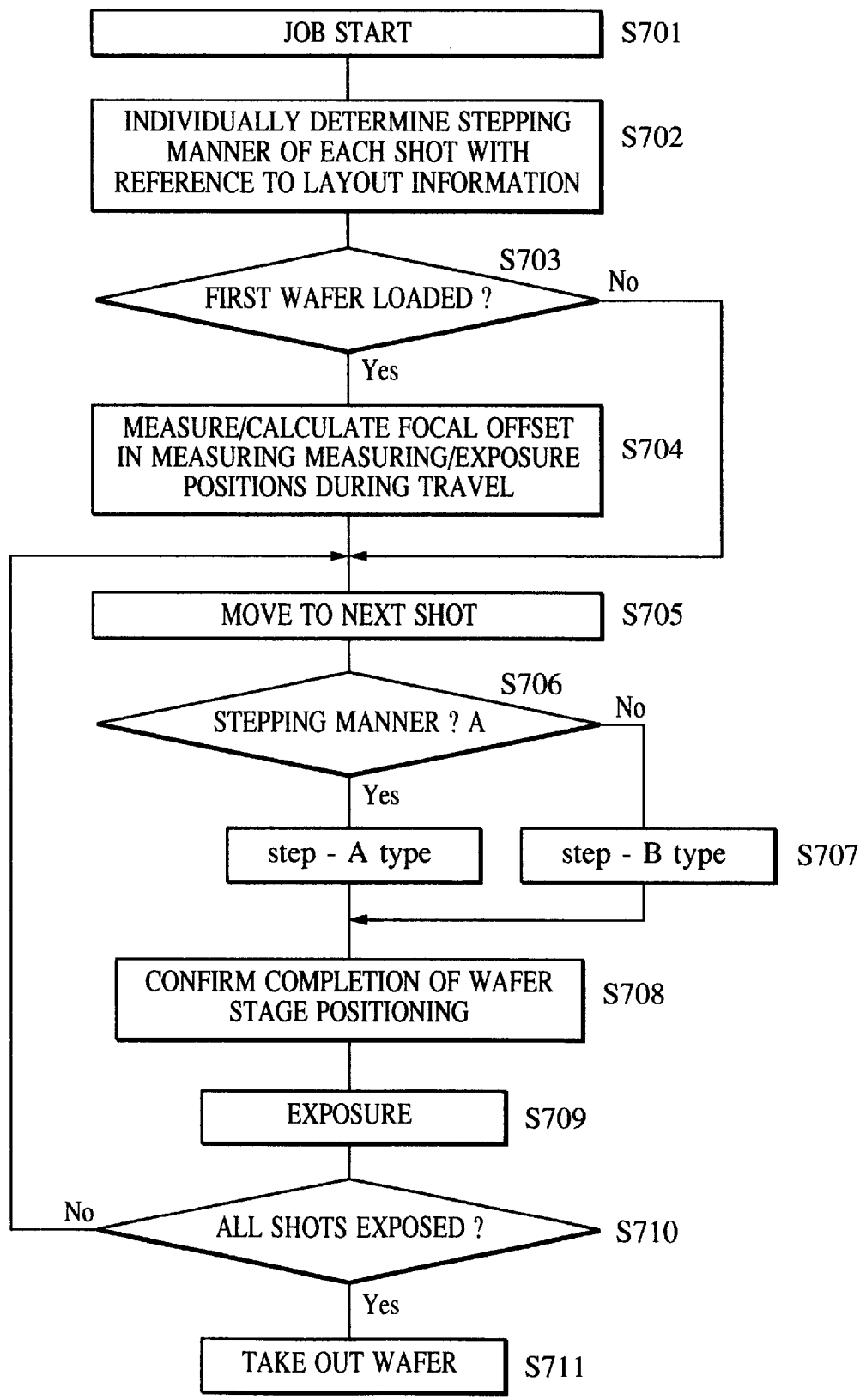
FIG. 7 is a flowchart illustrating an embodiment of the invention in which stepping travel is switched over for each shot on the basis of layout information.

Exposing operations of the apparatus shown in FIG. 1 will now be described with reference to the flowchart illustrated in FIG. 7. First, at step S701, the job is started, and at step S702, it is determined and selected, for each shot, which of the two manners of stepping travel is to be used: i.e., the accuracy-oriented manner of stepping travel (type A: correcting the focus at the exposure position or a position where the observation position is reached) and the speed-oriented manner of stepping travel (type B: correcting the focus at the in-travel measuring position). More specifically, when the stepping travel direction of the wafer 3 is in the X-axis direction, the accuracy-oriented type A is set for the shots at the line ends, and the speed-oriented type B, for the other shots.

For example, when the shot arrangement image is as shown in FIG. 4, the type B is set for SH4, SH5, SH8 and SH9, and type A, for the eight remaining shots. While the ratio of the accuracy-oriented type A is rather high when the number of shots is small, as in this example, when considering exposure of a large-diameter, for example, a 300 mm wafer 256 M chip that requires careful selection of a manner of stepping travel as described in this embodiment, the speed-oriented type B stepping travel can be selected for 76 shots (about 80%) out of 96 shots in total.

In an actual layout for mass production, this ratio becomes increasingly high because of shrinkage and cut-down. However, it may become necessary to adopt the accuracy-oriented type A for the accuracy of the next inside ship. For the determination in this case, the manner of stepping travel may be determined by assessing the stepping travel direction axial coordinates of the step position coordinates, i.e., in the case of stepping travel in the X-axis direction, the X-coordinates of that shot with a threshold value.

A manner of stepping travel is selected for each shot as described above, and then, at step S703 in FIG. 7, a wafer 2 in a lot is transferred onto the stage 3, and the sequence thereof is checked. If the set wafer 2 is the first one of that lot, then at step S704, a focus offset necessary for focus measurement in the two aforementioned manners of stepping travel is measured by a conventional method. With these operations, the selection of a manner of stepping travel and the measurement of focus offset for each shot of the wafer 2 processed within the lot are completed.

The exposure processing for each wafer in the lot will now be described. At step S705, preparations are made for transferring to the next exposure shot, and a position of that shot, a manner of stepping travel and a focus offset are set. At step S705, the adopted manner of stepping travel is checked: the stepping manner is switched over to the type A for an accuracy-oriented step, and to the type B for a speed-oriented step.

At step S708, the positioning position before exposure is finally confirmed, and exposure is executed at step S709. At step S710, the completion of exposure for all the shots is checked, and if not completed, the flow of steps S705 to S706 is repeated over again. When all of the shots have been exposed, the wafer is taken out at step S711. If the lot is not as yet completed, the process returns to step S703 to load the next wafer and continue the aforementioned exposure flow.

Cases in which focus detection is carried out on the exposure apparatus include, in addition to the above-mentioned case in which projection exposure is performed while continuously applying a reticle pattern onto the wafer 2 during step-and-repeat exposure, a case in which, after an interruption of exposure by intervention of an external operation, such as execution of a test command by the user (e.g., by the semiconductor chip maker), the exposure sequence is resumed, and a case in which, after measuring a mark showing a position on the wafer 2 or on the stage 3, such as measurement of global alignment, the exposure sequence is resumed. In these cases, when the stepping travel distance of the wafer 2 (stage 3) is long, the Z-direction position of the wafer 2 is not assured because of deformation (e.g., surface irregularities) of the wafer 2 or the presence of an external operation. It is, therefore, necessary that the detection range of focus by the detectors (4 to 11) be wider than the detection range upon continuous or step-and-repeat exposure.

In the case of a measurement different from continuous or step-and-repeat exposure, the measuring position can later be on the periphery of the wafer. The requirements regarding accuracy and speed differ between the stepping travel for continuous or step-and-repeat exposure and the other stepping travel, as described above. In the latter case, it is necessary to select the type A stepping travel, in which focus measurement and correction are accurately carried out at a stationary position with a widened detection range.

Figure 8:
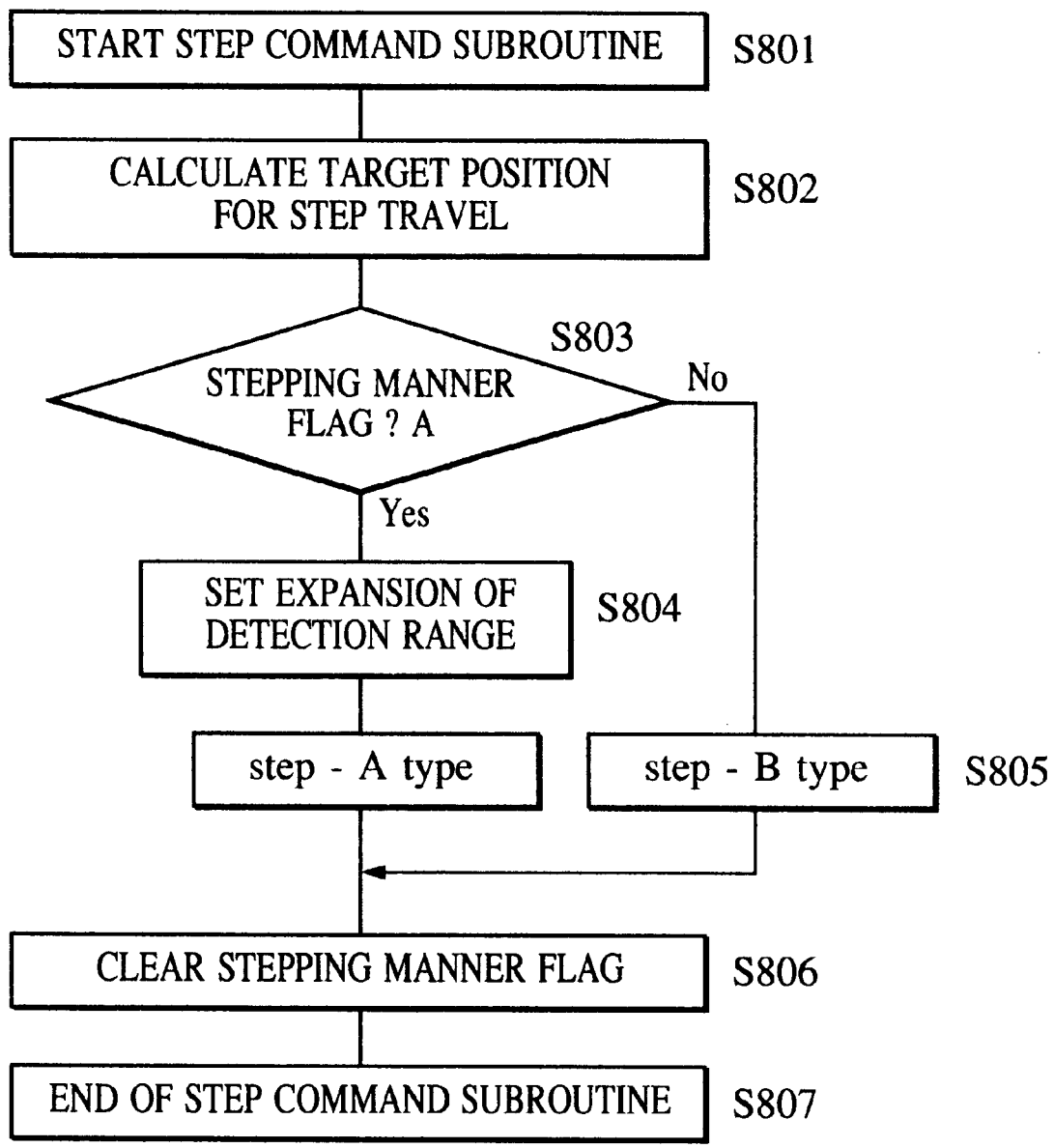
FIG. 8 is a flowchart illustrating an embodiment of the invention of a stepping travel selecting operation.

Another embodiment of the invention will now be described with reference to FIG. 8. FIG. 8 illustrates a functional module of a software program for executing stepping travel conditions. Prerequisites for starting this module are as follows.

First, when a user operation is present, the condition of continuous stepping travel (stepping travel upon step-and-repeat exposure) is impaired, and therefore, the type A stepping travel would be selected for the next shot. In this case, input of the user operation is detected, and an internal stepping travel manner selecting flag is turned on (selecting the type A). For global alignment measurement, it is possible to turn on the stepping travel manner selecting flag in terms of software, since a sequence has internally been determined. The stepping travel manner selecting flag is set for each step in the sequence, as described above, as a result of a determination of an external operation or an internal sequence.

Under these conditions, the functional module for stepping travel shown in FIG. 8 is called, and started at step S801. Then, at step S802, information necessary for stepping travel of the wafer 2, such as a target position, is set. Then, the stepping travel manner selecting flag, which is set when a special step is necessary, is checked at step S803. If it is on (selecting the type A), the focus detecting range of the detectors (4 to 11) is expanded at step S804, and at step S805, the accuracy-oriented type A stepping travel manner is executed. If the flag is off, indicating continuous stepping travel, the speed-oriented type B stepping travel manner is started at step S805. Irrespective of the selected manner of stepping travel, after confirmation of the completion of positioning at step S805, stepping travel of the wafer 2 is completed by turning off the stepping travel manner selecting flag at step S806.

In the above description, the measuring range of the detectors (4 to 11) has been expanded when the stepping travel manner selecting flag has been turned on. However, in the case of a detector of which the measuring time is not dependent upon the range, such as an analog sensor including a PSD (position selecting diode), the selection of the type A, which is less susceptible to the influence of vibration or the type B, which requires an offset to be previously measured may be made with a common detection range as it is.

Figure 9:
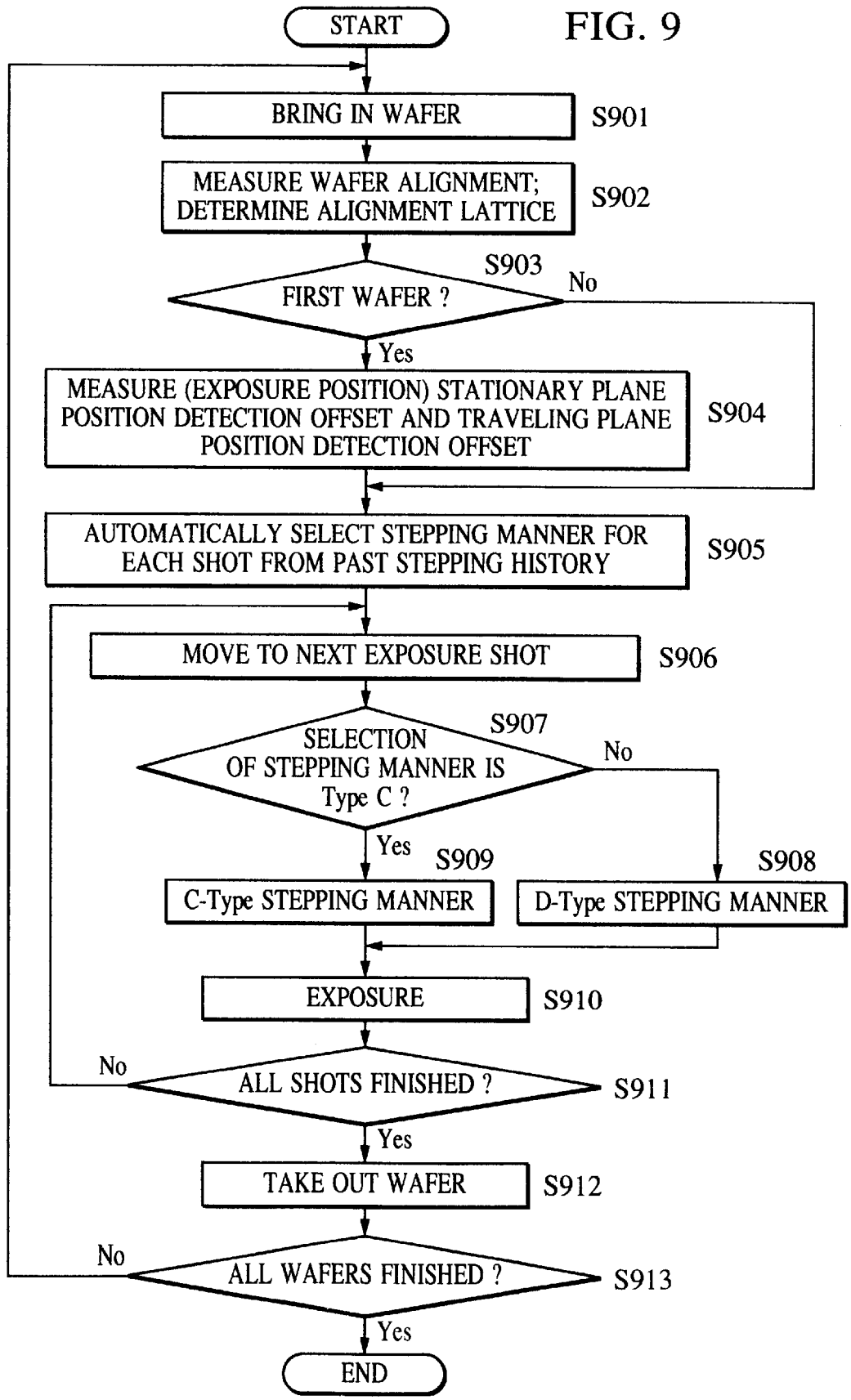
FIG. 9 is a flowchart illustrating an embodiment of the invention in which the manner of stepping travel is automatically switched over for each shot on the basis of past stepping history information.
Figure 10:
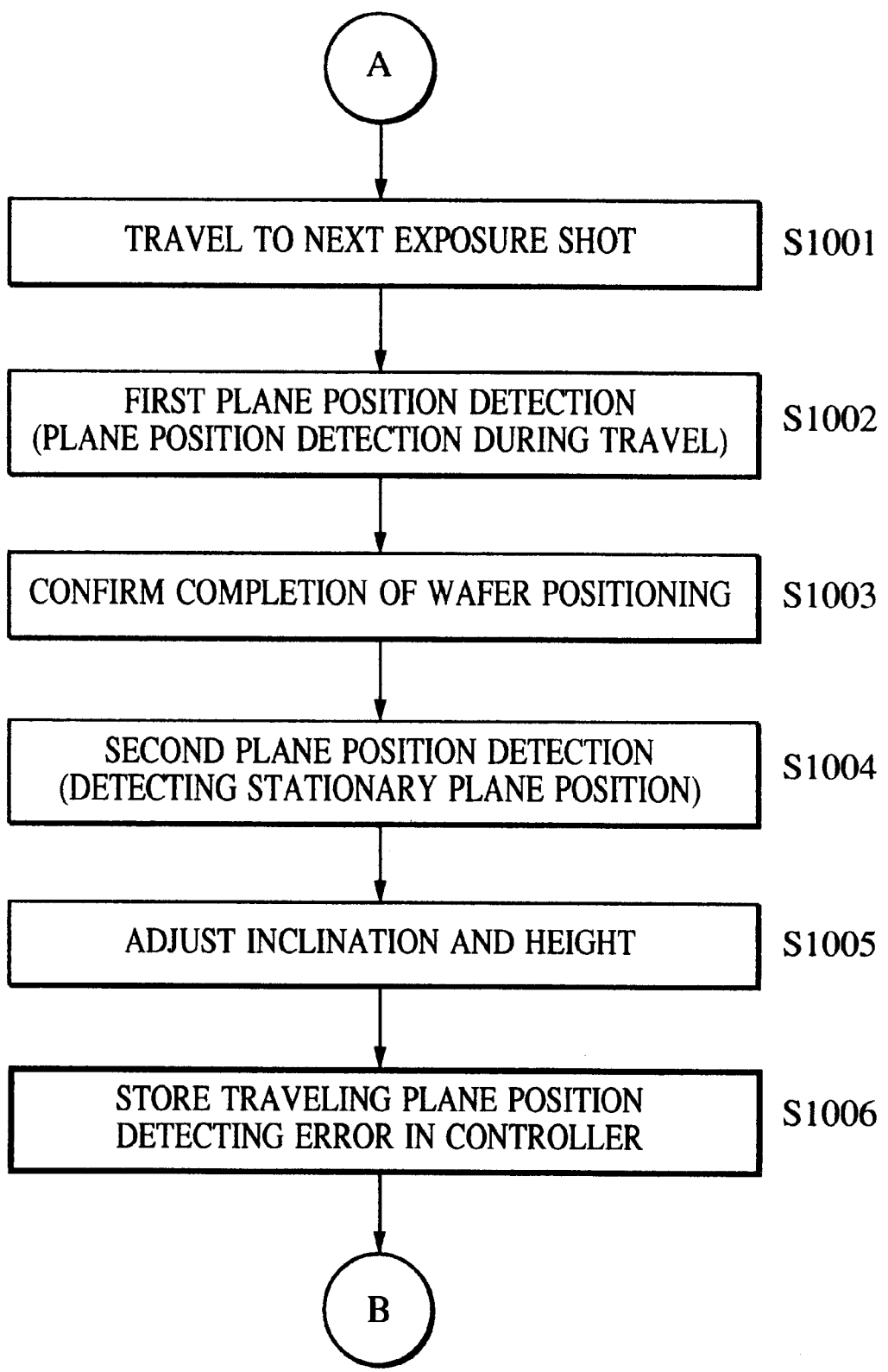
FIG. 10 is a flowchart illustrating an embodiment of the invention of a stepping travel selecting operation (type C)

A manner of accuracy-oriented stepping travel for automatic determination (type C), which is one of the stepping travel manners in the next embodiment (shown in FIG. 9), will be described in detail in accordance with the flowchart shown in FIG. 10, with reference to FIGS. 1 to 4.

First, a target position of the stage 3 is set in the controller 13 so that an exposure shot 100 comes to the exposure position below the lens 1, and then, travel of the wafer stage 3 is started (S1001). Then, the position of the exposure shot on the XY plane is monitored by the laser interferometer 17 and the controller 13. When the exposure shot reaches a prescribed position suitable for detecting the in-travel plane position, the detectors (4 to 11) conduct a first run of plane position detection (i.e., in-travel plane position detection) (S1002).

The in-travel plane position detection detects the plane position with respect to an image plane of the lens 1 of the exposure shot (exposure area) at the target stage position. In this manner of stepping travel (type C), the detection results of the detectors (4 to 11) are used mainly for calculating the plane position detecting accuracy during travel of the stage, and not for adjusting the height or inclination of the wafer 2.

The operations during stepping travel have now been completed. After confirming the completion of positioning of the wafer stage 3 on the XY coordinates (S1003), the detectors (4 to 11) perform a second run of the plane position detection (i.e., stationary plane position detection) (S1004). After the stationary plane position detection, the height and inclination of the wafer 2 are adjusted by using the detection results (S1005). A deviation from the exposure image plane of the lens 1 (i.e., the in-travel plane position detection error) is calculated for a case in which the height and the inclination of the wafer 2 are adjusted by the use of the results of the in-travel plane position detection from differentiation of data obtained by correcting the results of the in-travel plane position detection by the use of the focus offset 1 and data obtained by correcting the results of the stationary plane position detection by the use of the focus offset 2. The results of these calculations are classified for each exposure area 100 and stored in the controller 13 (S1006).

Figure 11:
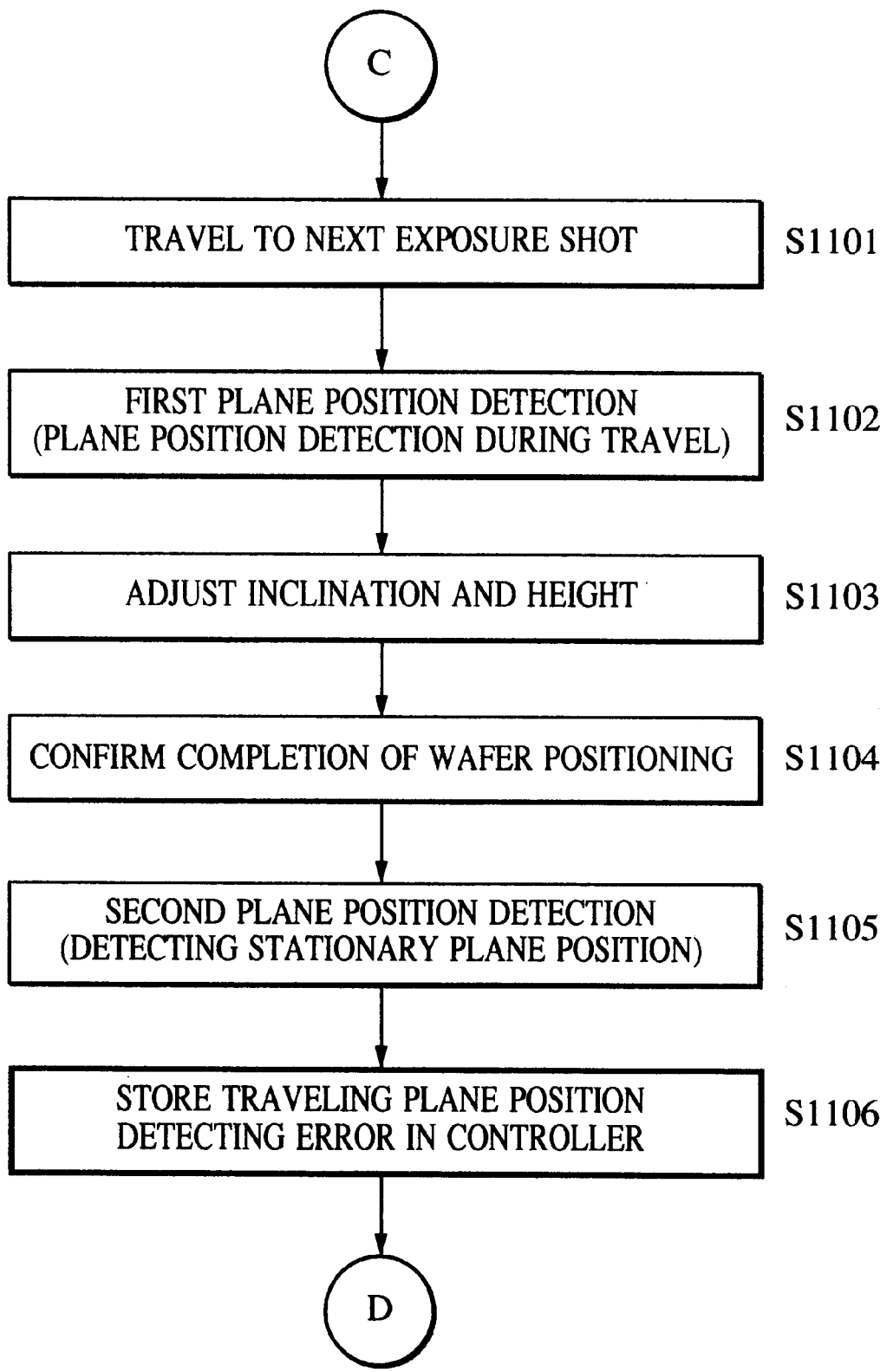
FIG. 11 is a flowchart illustrating an embodiment of the invention of a stepping travel selecting operation (type D)

The speed-oriented manner of stepping for automatic determination (type D), one of the manners of stepping travel in this embodiment, will now be described in detail in accordance with the flowchart shown in FIG. 11. First, travel of the wafer stage 3 is started after setting a target stage position in the controller 13, as in the aforementioned manner of stepping travel (type C). As in the type C, the detectors (4 to 11) perform a first run of plane position detection (i.e., in-travel plane position detection) at a prescribed position (S1102). Then, the height and the inclination of the wafer 2 are adjusted by a second driving unit by the use of data obtained by correcting the detection results with the aforementioned correction offset (S1103).

After the completion of this adjustment, and after confirming the completion of positioning of the wafer stage 3 on the XY coordinates, the detectors (4 to 11) carry out a second run of plane position detection (i.e., stationary plane position detection) (S1105). Detection of the stationary plane position has a main object to measure an error in adjustment of the height and the inclination by the use of the results of the in-travel plane position detection, and is not employed for adjusting the height or the inclination of the wafer 2. Finally, an error in the in-travel plane position detection is calculated from the results of the stationary plane position detection, and the results are classified for each exposure area 100 and stored in the controller 13 (S1106).

An embodiment using the above-mentioned manners of stepping travel will now be described in detail in accordance with the flowchart shown in FIG. 9.

First, at step S901, a patterned wafer 2 is fed onto a wafer stage 3 by a wafer feeder (not shown). At step S902, positional shifts in the X and Y directions relative to the optical axis AX and the reference layout of the wafer stage 3 are measured by an alignment mechanism (not shown). Lattices for stepping are calculated to match with the lattice of a shot arrangement already transferred onto the wafer 2, and stored in the controller 13. As a result, an offset dependent upon a step shape for each focus sensor (each detecting portion of the position detecting element 11) in each shot at the exposure position can primarily be determined.

Then, it is determined whether or not the wafer 2 set on the apparatus shown in FIG. 1 is the first one (step S903). If it is the first wafer, a measurement offset for calculating the plane position of the image plane reference at the exposure position is calculated from the focus detection value obtained when the shot 100 is at the exposure position. Further, another measurement offset for calculating the plane position of the image plane reference of the exposure position is calculated from the focus detection value during travel (step S904). As a result, it is possible to accurately detect the plane position of the image plane reference at the exposure position for the exposure position or for a prescribed position during travel.

Then, at step S905, the controller 13 calculates an in-travel plane position detecting accuracy from the history of in-travel plane position detection errors stored therein, and automatically selects a manner of stepping travel of the C or D type by determining the same with a threshold value or the like. This selection is made automatically for all of the shots from the history of the in-travel plane position detecting errors so far stored, every time a second or subsequent wafer is fed. History data, therefore, increases accordingly, as more wafers are processed, and reliability is automatically improved. As a result, as compared with a conventional empirical selection, it is possible to make a selection at a higher accuracy and a higher immediacy.

On the basis of the results of the automatic selection of the manner of stepping travel, a target stage position is set in the controller 13 so that the next exposure shot 100 comes to the exposure position below the lens 1. Then, travel of the wafer stage 3 is started (step S906). In response to the results of the automatic selection of the manner of stepping travel of the exposure shot 100, the type C manner of stepping travel (step S909) or the type D manner of stepping travel (step S908) is executed. After confirming the completion of positioning of all six axes after stepping travel, exposure is carried out at step S910.

At step S911, a loop control is performed to determine whether or not exposure of all of the shots has been completed. If exposure of all of the shots of the wafer 2 has not yet been completed, the wafer stage 3 is moved to the next exposure shot (step S906). If completed, the wafer on the wafer stage 3 is taken out (step S912). Similarly, at step S913, a loop control is performed to determine whether or not exposure of all of the wafers has been completed. If not completed, the next wafer is fed (step S901), and if completed, the processing comes to an end.

In this embodiment, the shot position where the manner of travel is switched over to the accuracy-oriented mode is determined from the point of view of the apparatus. When the production efficiency of the chips as a whole varies, the ratio of the speed-oriented stepping travel may be reduced under the effect of the automatic selection of stepping travel. In such a case, it is possible to return to the original chip productivity by cleaning a chuck or the stage, for example.

To cope with such circumstances, the following method is used in this embodiment. In FIG. 1, a database containing processing information is generated for each wafer regarding processing of a lot in a host terminal (not shown) connected to the controller 13 to retain therein Yes/No information for shots subjected to switching of the manner of stepping travel. After processing of the lot, the operator can check the processing time or the correction accuracy, and can determine a necessity of maintenance of the apparatus by accessing this database.

Another notifying method consists of calculating the switching frequency of the stepping manner during processing of the lot and the ratio of the speed-oriented stepping travel within a wafer, making a determination on the basis of a threshold value, and when a need to notify is determined, immediately notifying the operator on the host terminal screen or by the use of another display. The operator can, from time to time, change this threshold value in response to the degree of necessity required by the lot.

Yet another embodiment of the invention will now be described. The exposure apparatus of this embodiment includes means for measuring vibration of the stage, which forms a main cause of fluctuations of the accuracy upon in-travel detection of the plane position. If an electrostatic capacitive sensor is used, for example, as the vibration measuring instrument, it is possible to conduct real-time measurement of inclination. Stage vibration during detection of the plane position in stepping travel of each exposure shot is, therefore, measured by a vibration measuring instrument.

Upon stepping travel for each exposure shot of the next wafer, a manner of stepping travel is selected on the basis of values of vibration measured as described above. According to this embodiment, stage vibration itself, which is a main cause of vibration of the accuracy in plane position detection in travel, is used as a reference for the selection of a manner of stepping travel. It is, therefore, possible to estimate an accuracy upon in-travel plane position detection, even from a measured vibration value of a single wafer and thus, to determine a manner of stepping travel at an early timing.

Figure 12:
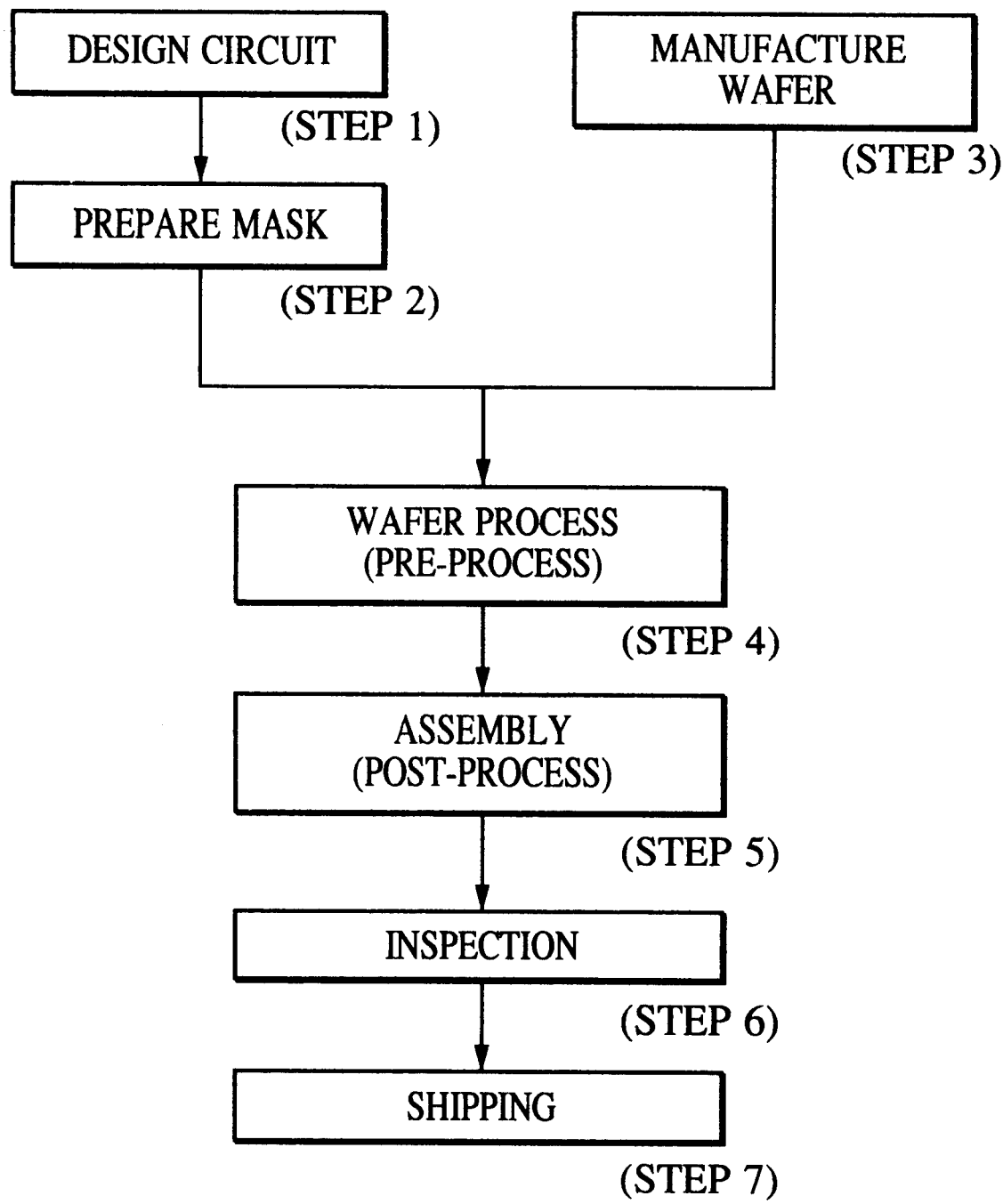
FIG. 12 illustrates the flow of manufacturing a semiconductor device.

An embodiment of a method for producing a device, such as a semiconductor device, by the use of the above-mentioned exposure apparatus or exposure method will now be described. FIG. 12 illustrates a manufacturing flowchart for micro-devices (e.g., semiconductor chips, such as ICs and LSIs, a liquid crystal panel, a CCD, a thin-film magnetic head and a micromachine). At step 1 (circuit design), a pattern design is performed for a device. At step 2 (preparation of mask), a mask having the designed pattern formed thereon is prepared. At step 3 (manufacture of wafer), on the other hand, a wafer is manufactured from a material such as silicon or glass.

Step 4 (wafer process) is called a pre-process, in which an actual circuit is formed on the wafer by lithographic technology, by the use of the thus prepared mask and wafer. At step 5 (assembly), which follows, a semiconductor chip is manufactured from the wafer prepared at step 4, and includes an assembly substep (dicing or bonding) and a packaging substep (sealing of chip). At step 6 (inspection), an operation confirming test, a durability test and the like are carried out on the semiconductor device prepared at step 5. The semiconductor device is completed through these step, and shipped (step 7).

Figure 13:
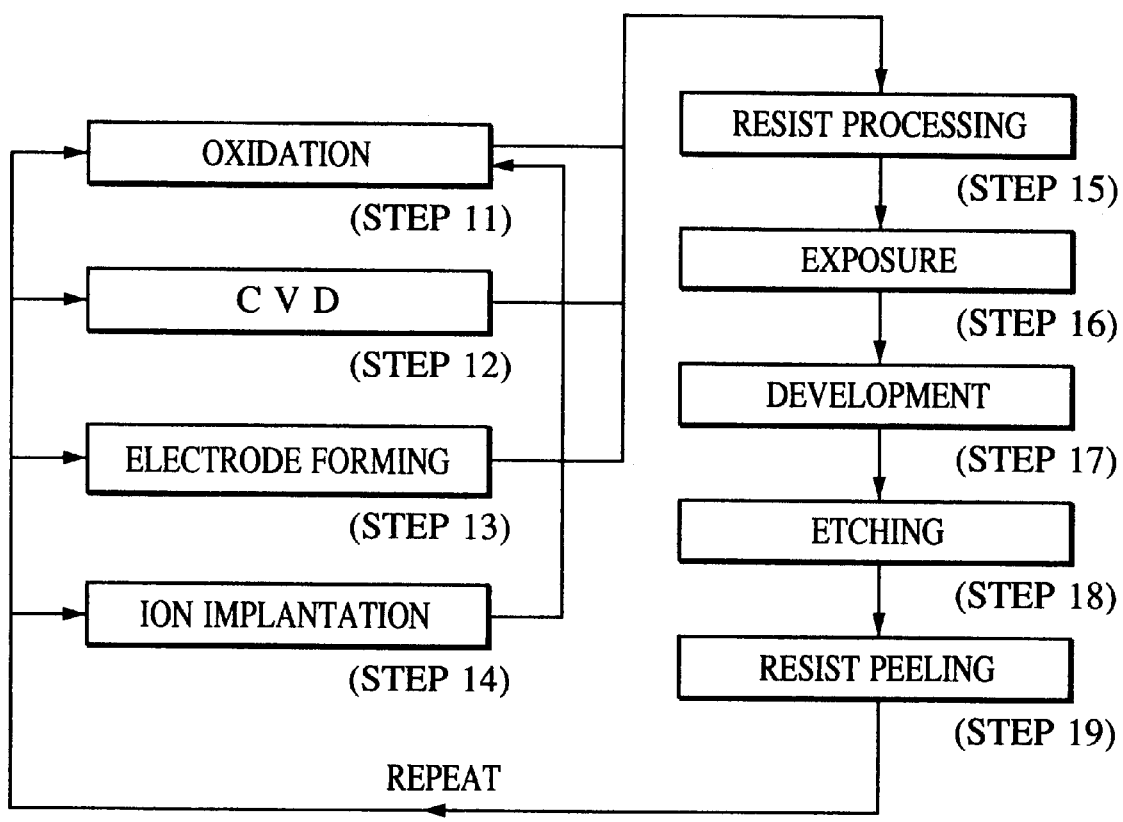
FIG. 13 is a flowchart illustrating the flow, in detail, of the wafer process shown in FIG. 12.

FIG. 13 illustrates a detailed flowchart of the aforementioned wafer process discussed above with respect to step 4 of FIG. 12. At step 11 (oxidation), the wafer surface is oxidized. At step 12 (CVD), an insulating film is formed on the wafer surface by chemical vapor deposition. At step 13 (forming electrodes), electrodes are formed on the wafer by vapor deposition. At step 14 (ion implantation), ions are injected into the wafer.

At step 15 (resist processing), a photosensitizer is coated onto the wafer. At step 16 (exposure), a circuit pattern of a mask is printed onto the wafer and exposed by an exposure apparatus adopting the plane position detecting method as described above. At step 17 (development), the exposed wafer is developed. At step 18 (etching), the developed portions other than the resist image are ground off or otherwise removed. At step 19 (resist peeling), any portion of the resist that has become unnecessary after etching is removed. Multiple circuit patterns are formed on the wafer by repeating these steps. With the production method of this embodiment, it is possible to manufacture, at a low cost, devices of a high degree of integration that have so far been difficult to manufacture.

Except as otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A plane position detecting method comprising the steps of:

moving a substrate in a direction intersecting an optical axis of a projection optical system substantially at right angles;

feeding an area on the substrate into an image space of the projection optical system;

detecting at least one of a position and an inclination of the substrate in the optical axis direction;

determining when the area agrees with a focal plane of the projection optical system; and automatically selecting one of a first mode of performing the detection during travel of the substrate and a second mode of performing the detection in a state in which the area is substantially positioned within the image space, the automatic selection being based on at least one of shot layout information on the substrate and history information of detecting results.

2. A method according to claim 1, further comprising setting a measurement position on the substrate for detecting at least one of the position and the inclination of the substrate in the optical axis direction within the area.

3. A method according to claim 1, wherein the area is each of a plurality of shots set on the substrate, and further comprising performing said selecting step on the basis of shot layout information on the substrate.

4. A method according to claim 1, further comprising placing the substrate on a stage traveling in a direction intersecting the optical axis of the projection optical system, and performing said selecting step on the basis of a position of the stage before starting travel of said substrate.

5. A method according to claim 1, further comprising, when either of the first and second modes is switched over to the other in said selecting step, notifying an operator of the mode switching.

6. A method according to claim 1, wherein the first mode includes a first step traveling manner comprising steps of sequentially feeding a plurality of shots set on the substrate as the area to the image space and detecting a plane position of the area, and the second mode includes a second step traveling manner of detecting the plane position of the area, and further comprising selecting a subsequent step traveling manner for each shot, on the basis of a history of a plane position correcting result obtained upon execution of the step traveling.

7. A method according to claim 6, further comprising performing said selecting step for each shot by the use of a threshold value derived from the history of the connection results for the shots of a plurality of substrates.

8. A method according to claim 6, further comprising placing the substrate on the stage, which travels in the direction intersecting the optical axis of the projection optical system substantially at right angles, and adopting, as the plane position correction result, a result of measurement of a vibrating state of an apparatus that includes the stage.

9. A method according to claim 6, further comprising, when either of the first and second modes is switched over to the other in said selecting step, notifying an operator of the mode switching.

10. A method according to claim 1, further comprising manufacturing a semiconductor device by exposing the substrate to a pattern using the projection optical system.

11. An exposure apparatus comprising:

a projection optical system;

a stage for moving a substrate in a direction intersecting an optical axis of said projection optical system substantially at right angles, to feed an area to be detected on the substrate to an image plane of said projection optical system;

detecting means for detecting at least one of a position and an inclination of the area to be detected relative to the direction of the optical axis, and for producing a detection value result;

focusing means for detecting a plane position of the area to be detected on the basis of the detection value, and for bringing the plane position into focus with a focal plane of the projection optical system; and selecting means for automatically selecting, as a step traveling manner for feeding the area to be detected into the image space, one of (i) a first step traveling manner of bringing the area to be detected into focus with the focal plane on the basis of plane position information measured during travel of the substrate, and (ii) a second step traveling manner of bringing the area to be detected into focus with the focal plane on the basis of the plane position information in a state in which the area to be detected is substantially positioned, relative to the direction of travel, with a prescribed position, the automatic selection being based on at least one of shot layout information on the substrate and history information of the detection results.

12. An apparatus according to claim 11, wherein said selecting means selects one of the first and second step traveling manners as a step traveling manner for sequentially feeding to the image space a plurality of shots set on the substrate as the area to be detected.

13. An apparatus according to claim 12, wherein said selecting means selects one of the first and second step traveling manners for each shot on the basis of shot layout information on the substrate.

14. An apparatus according to claim 11, wherein said selecting means selects one of the first and second step traveling manners on the basis of a position of the stage immediately before a start of the substrate travel.

15. An apparatus according to claim 11, further comprising range switching means for switching over a detection range of said detecting means in response to the selection by said selecting means, to change the detection range and the detection time.

16. An apparatus according to claim 12, wherein said selecting means selects a step traveling manner for each subsequent shot on the basis of a history of plane position correction results upon performing the step traveling.

17. An apparatus according to claim 16, wherein said selecting means adopts a result of measurement of a vibrating state of said apparatus as a result of the plane position correction upon executing the step traveling.

18. An apparatus according to claim 12, wherein said selecting means selects, for each shot, a step traveling manner for subsequent shots by the use of a threshold value derived from the history of correction results for the shots of a plurality of substrates.

19. An apparatus according to claim 18, wherein said selecting means adopts a result of measurement of a vibrating state of said apparatus as a result of the plane position correction upon executing the step traveling.

20. An apparatus according to claim 16, wherein said selecting means notifies an operator of mode switching when either of the first and second modes is switched over to the other.

21. A method of detecting a plane position, comprising the steps of:
   sequentially feeding a plurality of areas to be exposed on a substrate to exposure positions;
   detecting at least one of a position and an inclination of the substrate in an exposure axis direction;
   accomplishing plane positioning of the areas to be exposed at the exposure positions, on the basis of the detection in said detecting step; and
   switching over, for the substrate, a mode of the detection between one during travel for feeding the substrate and one in a state in which the areas to be exposed are substantially positioned at the exposure positions.

22. A method according to claim 21, wherein said switching step is performed on the basis of layout information of the areas to be exposed on the substrate.

23. A method according to claim 21, wherein said switching step is performed on the basis of a history of the results of plane position detection conducted for another substrate.

24. A method according to any one of claims 21 to 23, further comprising conducting exposure to the areas to be exposed, for which positioning has been accomplished.

25. An apparatus for detecting a plane position, said apparatus comprising:
   a feeder for sequentially feeding a plurality of areas to be exposed on a substrate to exposure positions;
   a detector for detecting at least one of a position and an inclination of the substrate in an exposure axis direction;
   plane positioning means for accomplishing plane positioning of the areas to be exposed at the exposure positions, on the basis of the detection by said detector; and
   switching means for switching over, for the substrate, a mode of the detection between one during travel for feeding the substrate and one in a state in which the areas to be exposed are substantially positioned at the exposure positions.

26. An apparatus according to claim 25, wherein said switching means performs the switching on the basis of layout information of the areas to be exposed on the substrate.

27. An apparatus according to claim 25, wherein said switching means performs the switching on the basis of a history of the results of plane position detection conducted for another substrate.

28. An apparatus according to any one of claims 25 to 27, further comprising means for conducting exposure of the areas to be exposed, for which positioning has been accomplished.

* * * * *

UNITED STATES PATENT AND TRADEMARK OFFICE
CERTIFICATE OF CORRECTION

PATENT NO. : 6,163,369
DATED : December 19, 2000
INVENTOR(S) : Yuichi Yamada, et al.

It is certified that error appears in the above-identified patent and that said Letters Patent is hereby corrected as shown below:

Column 4,
Line 10, "the" should be deleted.

Column 9,
Line 57, "ship." should read -- chip. --.

Column 15,
Line 56, "and" should read -- or --.

Signed and Sealed this

Sixth Day of November, 2001

*Attest:*

NICHOLAS P. GODICI
*Attesting Officer*    Acting Director of the United States Patent and Trademark Office